United States Patent [19]
Abernethy

[11] Patent Number: 5,384,554
[45] Date of Patent: Jan. 24, 1995

[54] VOLTAGE CONTROLLED OSCILLATOR CIRCUIT EMPLOYING INTEGRATED CIRCUIT COMPONENT RATIOS

[75] Inventor: Brian Abernethy, Phoenix, Ariz.

[73] Assignee: CalComp Inc., Anaheim, Calif.

[21] Appl. No.: 163,964

[22] Filed: Dec. 8, 1993

[51] Int. Cl.$^6$ ............................................. H03K 3/03
[52] U.S. Cl. ................................ 331/153; 331/173; 331/177 R
[58] Field of Search .............. 331/111, 143, 153, 173, 331/177 R

[56] References Cited
U.S. PATENT DOCUMENTS

| | | | |
|---|---|---|---|
| 3,708,762 | 1/1973 | Nilsson | 331/108 B |
| 3,914,712 | 10/1975 | Currie | 331/111 |
| 4,006,430 | 2/1977 | Meyer-Ebrecht | 331/65 |
| 4,794,350 | 12/1988 | Meyer-Ebrecht | 331/65 |
| 5,136,262 | 8/1992 | Spencer | 331/135 |

Primary Examiner—Siegfried H. Grimm
Attorney, Agent, or Firm—Wm. F. Porter, Jr.; Donald Streck

[57] ABSTRACT

An integrated voltage controlled oscillator (VCO) circuit which utilizes the relative capacitance ratio between capacitors and the relative resistance ratio between resistors in an integrated circuit (IC) to output a signal having a predictable frequency for a given control signal voltage. The VCO output frequency will not vary more than 3.0% from one IC chip implementing the VCO circuit, to the next. This low variance between IC chips is derived from the phenomenon whereby the respective ratios of capacitance and resistance between capacitors and resistors in the IC will not vary more than ±1.5% from the ratios of like capacitors and resistors on other IC chips. The integrated VCO circuit includes a control signal subcircuit, integrator subcircuit, filter subcircuit, and comparator unit subcircuit.

9 Claims, 2 Drawing Sheets

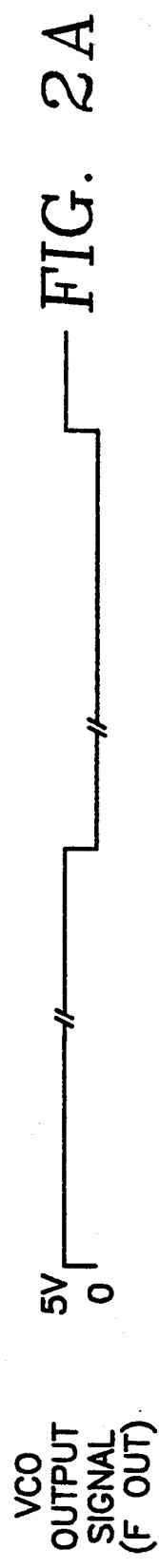
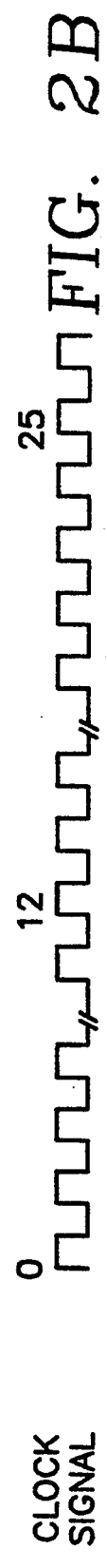
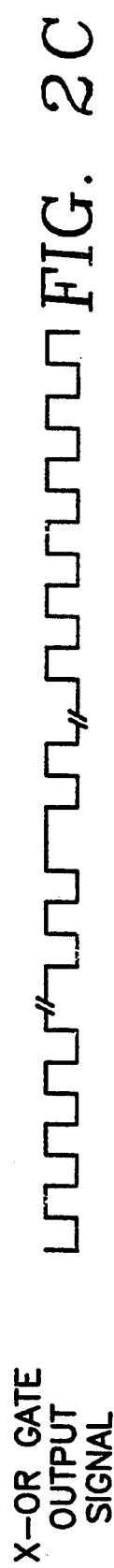
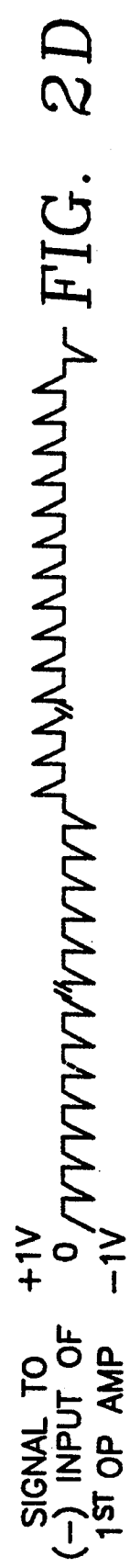
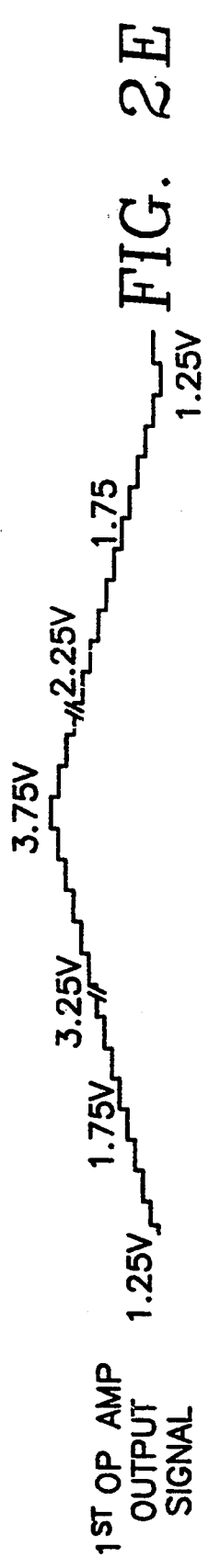

VOLTAGE CONTROLLED OSCILLATOR CIRCUIT EMPLOYING INTEGRATED CIRCUIT COMPONENT RATIOS

BACKGROUND OF THE INVENTION

1. Technical Field

This invention relates to a voltage controlled oscillator (VCO) circuit, and particularly to an integrated circuit (IC) implemented VCO wherein ratios of IC component values are employed to produce an output signal having a frequency proportional to the voltage of a control signal.

2. Background Art

Circuit components on an IC have very poor actual tolerances from one IC to the next. Specifically, the capacitance of a capacitor, or the resistance of a resistor could vary as much as ±20%. For instance, suppose it was desired that an IC have a 10 ohm resistor as part of the circuit implemented thereon. After fabrication, this resistor on one IC chip in a lot may have the desired 10 ohm resistance, while the same resistor on other like chips could exhibit resistance anywhere from 8 ohms to 12 ohms (i.e. ±20% variance). Consequently, the circuit from one IC chip to the next could exhibit significantly different characteristics. In the case of a VCO, this above-described variance is particularly problematic. Many well known VCO circuits rely on a resistor and capacitor to set the frequency of the output signal to a specific level based on the voltage of a control signal. If the resistance and capacitance of these respective components were allowed to vary up to ±20% between IC chips, then worst case, the frequency of the output signal at a given control signal voltage could vary up to ±40%. This level of variance is clearly unacceptable for mass produced electronic devices employing a VCO circuit. As a result, a variety of external circuitry has been required in the past to ensure one IC chip exhibited the same frequency output characteristics as another.

It is, therefore, an object of the present invention to provide the architecture for an integrated VCO circuit whose output frequency does not vary significantly from one IC chip to the next, for a given control signal voltage input.

It is further object of the present invention to provide the architecture for an integrated VCO circuit which does not require external circuitry for consistency between IC chips.

And, it is still another object of the present invention to provide the architecture for an integrated VCO circuit which accomplishes a close matching of characteristics between IC chips by employing the phenomenon whereby IC component resistance and capacitance value ratios do not vary significantly from one IC chip to another.

Other objects and benefits of the invention will become apparent from the detailed description which follows hereinafter when taken in conjunction with the drawing figures which accompany it.

SUMMARY

The foregoing objects have been attained generally by an architecture for an integrated voltage controlled oscillator (VCO) circuit which utilizes the relative capacitance ratio between capacitors and the relative resistance ratio between resistors in an integrated circuit (IC), rather than relying on their actual values, to set the frequency of an output signal given a specific control signal voltage. While IC components may vary up to ±20% in their actual value from one IC chip to the next, the ratios between these same components on any one chip does not vary significantly between chips. For instance, the ratio of the capacitance between two capacitors on a first IC chip will not vary more than ±1.5% from like capacitors on a second IC chip, even though the actual value of their capacitance may vary greatly. The same is also true for resistors.

The above-described phenomenon is employed in the following VCO circuit embodying the present invention. This circuit includes inputs for a clock signal and control signal, along with a control signal subcircuit, integrator subcircuit, a filter subcircuit, and a comparator unit subcircuit. The control signal subcircuit is connected to the clock signal and control signal inputs. It is used for outputting a signal having either a negative or positive voltage. The output of the comparator unit subcircuit is employed to determine which of control signal subcircuit output options is generated. If the output of the comparator unit subcircuit is at a first voltage, the positive voltage signal is generated, and if the comparator unit subcircuit is at a second voltage, the negative voltage signal is generated.

The integrator subcircuit is connected to the output of the control signal subcircuit. The integrator subcircuit is used for either increasing or decreasing the voltage of its output signal. The voltage is increased if the voltage of the output of the control signal subcircuit is negative and is increased if the voltage is positive.

The filter subcircuit is connected between the integrator and comparator unit subcircuits. This filter is used to smooth out the signal output by the integrator subcircuit.

The comparator unit subcircuit is connected to the output of the filter subcircuit. This subcircuit is use for outputting a signal having a first voltage whenever the voltage of the signal output by the integrator subcircuit has increased to a first pre-determined level and a second voltage whenever the voltage of the signal output by the integrator subcircuit has decrease to a second predetermined level. The comparator unit subcircuit output signal constitutes the output of the VCO circuit.

In addition, the signals output by the integrator and comparator unit subcircuits are further dependent on the ratio of circuit components included within the integrated VCO circuit. Specifically, the voltage of the signal output from the integrator subcircuit is dependent on the ratio of capacitance between a first or second capacitor resident in the control signal subcircuit and a third capacitor resident in the integrator subcircuit. Similarly, the signal output by comparator unit subcircuit is dependent on the ratio of resistance of three resistors resident in the comparator unit subcircuit.

DESCRIPTION OF THE DRAWINGS

These and other features, aspects, and advantages of the present invention will become better understood with regard to the following description, appended claims, and accompanying drawings where:

FIGS. 2A–2F are graphs of the contemporaneous waveforms of a VCO output signal, a clock signal, an exclusive-OR gate output signal, a signal to the inverting input of an operational amplifier, an operational amplifier output signal, and a signal to the inverting input of a comparator, respectively, associated with the electrical circuit of FIG. 1.

DETAILED DESCRIPTION OF THE PREFERRED EMBODIMENT

Figure 1:
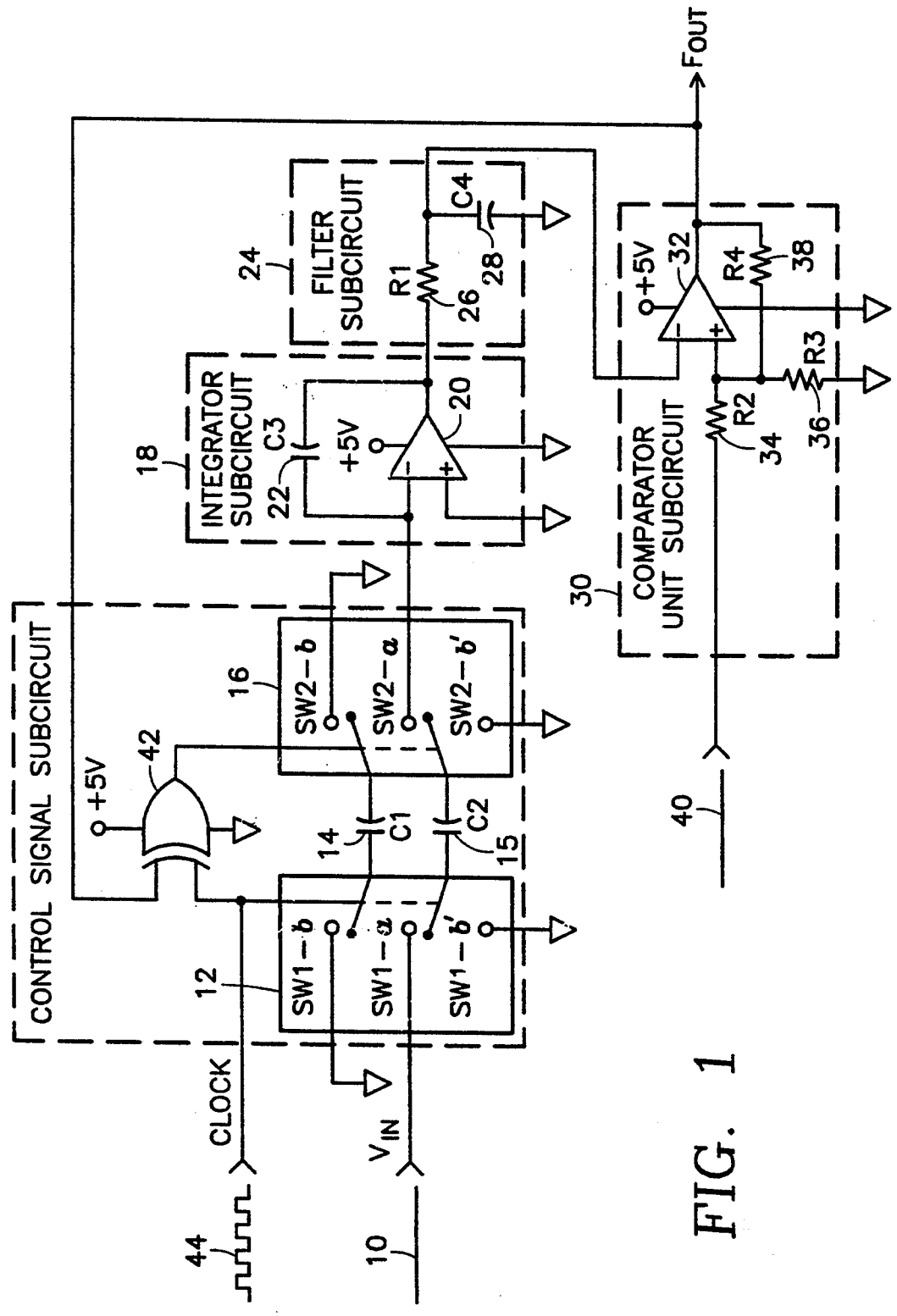
FIG. 1 is an electrical schematic diagram of an embodiment of the present invention.

A voltage controlled oscillator (VCO) circuit according to the present invention is shown in FIG. 1. A control input signal 10 is input to the sw1-$a$ pole of switch 12. The sw1-$b$ pole of switch 12 is connected to ground potential, as is the sw1-$b'$ pole. The first output of the switch 12 is connected a first capacitor 14, and the second output of switch 12 is connected to a second capacitor 15. The other side of the first capacitor 14 is connected to the first input of a second switch 16, and the other side of the second capacitor 15 is connected to the second input of the second switch 16. The sw2-$b$ and sw2-$b'$ poles of the second switch 16 are connected to ground potential, and the sw2-$a$ pole of the switch 16 is connected an integrator 18. In a preferred version of the invention, the integrator 18 includes an operational amplifier 20 having its output fed back through a third capacitor 22 to its inverting input. The non-inverting input to the operational amplifier 20 is connected to ground potential. Therefore, the integrator 18 is preferably an integrating operational amplifier. The output of the integrator 18 is connected to a filter 24 used to smooth the stepped output of the operational amplifier 20. The filter 24 includes a first resistor 26 connected to the input of the filter 24. There is also a fourth capacitor 28 connected between the output of the resistor 26 and ground. The output of the filter 24 is in turn connected to a comparator unit 30. The comparator unit 30 preferably includes a comparator 32 having its inverting input connected to the output of the filter 24. The output of the comparator 32 is fed back through a voltage divider network to its non-inverting input. The voltage divider network is made up of a second resistor 34 connected to window supply voltage signal 40, a third resistor 36 connected to ground, and a fourth resistor 38 connected between the output of the comparator 32 and a juncture connecting all three resistors 34, 36, 38 to the non-inverting input.

The signal output from the comparator unit 30 constitutes the output signal of the VCO circuit. This output is also connected to one of the inputs to an exclusive-OR gate 42. The other input to the gate 42 is connected to a clock signal 44. The clock signal 44 is also used to control the switching of the first output of the first switch 12 between its poles, sw1-$a$ and sw1-$b$, and the switching of the second output between poles, sw1-$a$ and sw1-$b'$. The first and second outputs of the first switch 12 are ganged so that when the first output is switched to the sw1-$a$ pole, the second output is switched to the sw1-$b'$ pole. Similarly, when the first output of the first switch 12 is switched to the sw1-$b$ pole, the second output is switched to the sw1-$a$ pole. The output of the exclusive-OR gate 42 is used to switch the first input of the second switch 16 between its poles, sw2-$a$ and sw2-$b$, and to switch the second input of the second switch 16 between poles, sw2-$a$ and sw2-$b'$. The first and second inputs of the second switch 16 are ganged so that when the first input is switched to the sw2-$a$ pole, the second input is switched to the sw2-$b'$ pole. Similarly, when the first input of the second switch 16 is switched to the sw2-$b$ pole, the second input is switched to the sw1-$a$ pole.

The switches 12, 16 are configured such that the first output of the first switch is connected to the sw1-$a$ pole whenever the clock signal 44 is high. Therefore, the first switch's second output will be connected to the sw1-$b'$ pole when the clock signal 44 is high. Whenever the clock signal 44 is low, the first output of the first switch 12 will be connected to the sw1-$b$ pole, and the switch's second output will be connected to the sw1-$a$ pole. Similarly, the first input of the second switch is connected to the sw2-$a$ pole whenever the output of the exclusive-OR gate 42 is high, and to the sw2-$b$ pole whenever the gate's output is low. Therefore, the second switch's second input will be connected to the sw2-$b'$ pole when the clock signal 44 is high, and to the sw2-$a$ pole when the clock signal is low. As can readily be seen, this switch configuration results in the first and second capacitors 14, 15 being switched exactly opposite each other.

The exclusive-OR gate 42 inverts the clock signal 44 if the output from the comparator unit 30 is high, and passes it through unchanged if the comparator unit output is low. This results in the first and second capacitors 14, 15 being switched differently depending on if the output from the comparator unit 30 is high or low, although they will still be exactly opposite each other. For instance, when the output from the comparator unit 30 is high and the clock signal 44 is high, the first capacitor's left side is connected to the control input signal 10, and its right side is connected to ground, i.e. because the output from the exclusive-OR gate 42 is low. At the same time, the second capacitor's left side is connected to ground and its right side is connected to the integrator 18. When the clock signal 44 goes low, the first capacitor 14 becomes connected like the second capacitor 15 previously was, and visa versa. The purpose of this role reversal is to increase the speed of the overall circuit. As will be explained below, when one of the capacitors 14, 15 is connected to the control input signal 10, it is in a charging mode. This same capacitor is subsequently discharged when it is connected to the integrator 18. This discharging is key to the operation of the VCO circuit. If only one capacitor were switched, the rest of the VCO circuit would only operate when the capacitor is connected to the integrator. The time during which the capacitor is charging would be lost. However, by using two capacitors which are alternately charging and being connected to the integrator, the lost time is eliminated. Therefore, the rest of the VCO circuit is always operating.

In the case where the output from the comparator unit 30 is low, and the clock signal 44 high, the left side of the first capacitor 14 will be connected to the control input signal 10 and the right side will be connected to the integrator 18, i.e. because the output from the exclusive-OR gate will also be high. At the same time, both sides of the second capacitor 15 will be connected to ground. When the clock signal 44 goes low, the first capacitor 14 becomes connected like the second capacitor 15 previously was, and visa versa. Here again, this process speeds up the operation of the rest of the VCO circuit. As will be discussed below, when one of the capacitors 14, 15 is connected between the control input signal 10 and the integrator 18, it charges and promulgates the operation of the rest of the VCO circuit. This capacitor must be discharged before any further operations can occur. Accordingly, both sides of the capacitor are connected to ground. If there was only one capacitor, the time required to switch and discharge it would be wasted. However, with two capacitors alternating between the charge mode and discharge mode, the rest of the VCO circuit can be constantly driven.

It should also be noted that the switches 12, 16 are of the non-shorting type to avoid any instantaneous connection between the poles of the switch. This eliminates any noise problems that might occur otherwise.

The operation of the VCO circuit embodied by this invention will now be described in reference to FIGS. 1 and 2A–2F. For purposes of this description, it is preferred that the third capacitor 22 has ten times the capacitance of the first and second capacitors 14, 15. In addition, the second and third resistors 34, 36 of the comparator unit 30, preferably exhibit twice the resistance as the fourth resistor 38. It is also preferred that the power supply voltage be 5 volts DC, and that the window supply voltage be set to 5 volts. Given the relative values of the second, third and fourth resistors 34, 36, 38, and the aforementioned power supply and window supply voltages, when the output of the comparator unit 30 is high (i.e. 5 volts), the input voltage to the non-inverting input of the comparator 32 would be 3.75 volts. In addition, when the output of the comparator unit 30 is low (i.e. 0 volts), the input voltage to the non-inverting input would be 1.25 volts. The relationship between the resistance values of the second, third and fourth resistors 34, 36, 38 and the voltage at the non-inverting input to the comparator 32 is described by:

$$V_{ni-input} = \frac{V_{ws}R_3R_4 + V_{Fout}R_2R_3}{R_2R_3 + R_2R_4 + R_3R_4} \quad (1)$$

where $V_{ni-input}$ is the voltage of the signal input to the comparator's non-inverting input, $V_{ws}$ is the window supply voltage, $V_{Fout}$ is the voltage of the signal output from the comparator unit 30, and $R_2$, $R_3$, and $R_4$ are the resistance values of the second, third and fourth resistors 34, 36, 38, respectively.

The aforementioned ratios of the resistance values of the second, third and fourth resistors 34, 36, 38 provide for a a voltage window of 2.5 volts. For example, the output of the comparator unit 30 will be high until the voltage at the inverting input of the comparator 32 reaches 3.75 volts. At that point, the output would go low and the non-inverting input would be at 1.25 volts. The output of the comparator unit 30 will remain low until the voltage at the inverting input to the comparator 32 drops to 1.25 volts. The output would then return to a high level and the cycle will be repeated.

The clock signal 44 is preferably set to a frequency of 1 MHz. It is also noted that the first resistor 26 and the fourth capacitor 28 of the filter 24, are set to a very high frequency so as to have only a negligible effect on the operating frequency of the oscillator circuit. Specifically, the filter 24 is preferably a low pass filter having a cut-off frequency of approximately ten times the operating frequency of the oscillator circuit. This filter 24 has the effect of reducing noise associated with the output from the integrator 18, which could interfere with the operation of the comparator unit 30.

For purposes of describing the operation of the VCO circuit embodied by the subject invention, assume that the control input signal 10 is 1 volt, the operational amplifier's output is currently at 1.25 volts, and the output of the comparator unit 30 is high.

As explained above, when the clock signal 44 is high, the sw1-$a$ pole of the first switch 12 will be connected to the left side of the first capacitor 14, and the sw2-$b$ pole of the second switch 16 will be connected to the right side of the first capacitor 14. This occurs because the clock signal 44 and the output of the exclusive-OR gate 42 are inverted from each other when the output from the comparator unit 30 is high, as shown in FIGS. 2A–2C. With the switches 12, 16 in the above configuration, the first capacitor will be charged to 1 volt by the control input signal 10. When the clock signal 44 drops to a low, the switches 12, 16 will reverse, with the sw1-$b$ pole of the first switch 12 being connected to the left side of the first capacitor 14, and the sw2-$a$ pole of the second switch 16 being connected to the right side of the first capacitor 14. Since the first capacitor 14 has a 1 volt charge across it, and its left side is now grounded, the right side of the first capacitor 14 will be at a potential of negative 1 volt. This negative voltage at the inverting input to the operational amplifier 20 will cause its output to swing positive until the voltage on its two inputs is the same (i.e. 0 volts). As shown in FIGS. 2D and 2E, because the capacitance of the third capacitor 22 is ten times the value of the first and second capacitors 14, 15, the output of the operational amplifier 20 need only rise 0.1 volt to cause the first capacitor 14 to discharge and the voltages at the inputs to the operational amplifier 20 to balance. Therefore, the output of the operational amplifier 20 will now be at 1.35 volts. Meanwhile, the left side of the second capacitor 15 will be connected to the sw1-$a$ pole, and so the control input signal 10. In addition, the right side of the second capacitor 15 will be grounded through the sw2-$b'$ pole. Therefore, while the first capacitor 14 is discharging and causing the output of the operational amplifier 20 to rise in voltage, the second capacitor 15 is charging. When the clock signal 44 rises again, the first capacitor 14 will be recharged to 1 volt, and the second capacitor will cause the operational amplifier 20 to rise. This process will repeat itself with every change in the clock signal. Accordingly, each half cycle of the clock signal 44 will increase the output of the operational amplifier 20 by 0.1 volts.

After 12.5 clock cycles, it can be seen that the signal to the inverting input of the comparator 32 would have reached 3.75 volts, as shown in FIG. 2F. Therefore, the voltage at the inverting input will be the same as that on its non-inverting input. Accordingly, the output of the comparator unit 30 will switch to 0 volts and the non-inverting input to the comparator 32 will be at 1.25 volts, as described above.

Since the output of the comparator unit 30 is now low, the first and second capacitors 14, 15 will be switched differently, as described above, because the clock signal 44 will pass through the exclusive-OR gate 42 unchanged. For example, assume the clock signal is low. The sw1-$b$ pole of the first switch 12 will be connected to the left side of the first capacitor 14, and the sw2-$b$ pole of the second switch 16 will be connected to the right side of the first capacitor 14. This occurs because the clock signal 44 and the output of the exclusive-OR gate 42 are in phase with each other when the output from the comparator unit 30 is low, as shown in FIGS. 2A–2C. Since both sides of the first capacitor 14 are connected to ground, the capacitor 14 will completely discharge. Meanwhile, the left side of the second capacitor 15 will be connected to the sw1-$a$ pole of the first switch 12, and the right side will be connected to the sw2-$a$ pole of the second switch 16. It can be seen in FIG. 2D that with the switches 12, 16 in this configuration, the second capacitor 15 will be charged to 1 volt by the control input signal 10. Therefore, the inverting input of the operational amplifier 20 will be at a positive 1 volt potential. The operational amplifier 20 will respond by pulling its output voltage lower until the inverting input is at the same voltage as the non-inverting input, i.e. 0 volts. Since the capacitance of the third capacitor 22 is ten times the value of the second capacitor 15, the output of the operational amplifier 20 need only drop 0.1 volt to accomplish this balance. Therefore, as shown in FIG. 2E, the output of the operational amplifier 20 will now be at 3.65 volts (i.e. because it was at 3.75 volts when the output of the comparator unit 30 went low). Then, when the clock goes high, the situation will reverse. The second capacitor 15 will be discharged and the first capacitor will cause the output of the operational amplifier to drop 0.1 volts. This process will repeat itself each time the clock signal 44 changes states. Accordingly, each half cycle of the clock signal 44 will decrease the output of the operational amplifier 20 by 0.1 volts.

So, after 12.5 clock cycles, the output of the operational amplifier 20 would have dropped to 1.25 volts, causing the voltage at the inverting input to the comparator 32 to be the same as that on its non-inverting input. This is shown in FIG. 2F. Therefore, the output of the comparator unit 30 will switch to 5 volts again, and the non-inverting input to the comparator 32 will return to 3.75 volts. This places the VCO circuit back into the identical state it was in at the beginning of this description.

As can be seen, it took 25 clock cycles to create 1 cycle of the signal output by the comparator unit 30. Since the frequency of the clock signal 44 is 1 MHz, the frequency of the comparator unit output signal must be 40 KHz (i.e. 1,000,000 cps/25). If the voltage of the control input signal 10 is raised or lowered, the frequency of the output signal from the comparator unit 30 will be directly effected. For example, if the voltage of the control input signal 10 is raised by 25% to 1.25 volts, only 10 clock cycles will be required to switch the output of the comparator unit 30. Accordingly, 1 cycle of the comparator unit output will occur every 20 clock cycles. This results in a comparator unit output signal frequency of 50 KHz (i.e. 1,000,000 cps/20). This is a 25% increase in the frequency of the output signal. Therefore, every percent increase or decrease in the control input signal voltage will result in a respective percent increase or decrease in the frequency of the comparator unit output signal.

The relationship between the control input signal voltage and the frequency of the signal output by the oscillator circuit (i.e. from the comparator unit 30) is described by the equation:

$$F_{out} = \left| \frac{(V_{in}) \times (F_c)}{(V_w)} \right| \times \left| \frac{C_{1/2}}{C_3} \right| \quad C_{1/2} < C_3, V_{in} \leq V_{ps}, \text{ and } V_w < V_{ps} \quad (2)$$

where $F_{out}$ is the frequency of the signal output by the oscillator circuit, $V_{in}$ is the control input signal voltage, $F_c$ is the frequency of the clock signal, $V_w$ is the voltage window associated with the non-inverting input of the comparator 32, $C_{\frac{1}{2}}$ is the capacitance of the first or second capacitor 14, 15 (which are the same), $C_3$ is the capacitance of the third capacitor 22, and $V_{ps}$ is the voltage of the power supply. The limitations whereby $C_{\frac{1}{2}} < C_3$, $V_{in} \leq V_{ps}$, and $V_w < V_{ps}$, are necessary to ensure the proper operation of the operational amplifier 20 and the comparator 32.

Equation 2 shows that the relationship between the frequency of the output signal and the control input signal voltage depends on the relative values of the first and second capacitors 14, 22, and the second, third and fourth resistors 34, 36, 38, not their actual values. As disclosed previously the actual values of circuit element components on an IC chip can vary greatly between chips. However, their relative values are substantially steady from one chip to the next. They typically do not vary more than ±1.5%.

The above-described circuit takes advantage of this phenomenon by making the frequency output by the circuit dependent on the relative values of the components rather than their actual values. In this way the frequency of the output signal at a given control signal voltage is consistent between IC chips, due to the ratios between like IC components not varying significantly between chips. For example, in the description provided above, the capacitance of the third capacitor 22 will always be approximately equal to ten times that of the first and second capacitors 14, 15 from one IC chip to the next, even though the measure of their actual capacitance may vary considerably. The same situation occurs in the voltage divider network of the comparator unit 30. The second, third and fourth resistors 34, 36, 38 will all vary in resistance from one IC chip to the next. However, these resistance values will remain proportional to each other. Therefore, in the above-described circuit, the second and third resistors 34, 36, on any one IC chip, will be twice the value of the fourth resistor 38, within the aforementioned tolerance range.

Accordingly, the frequency of the signal output from the circuit on any one IC chip is predictable within twice the aforementioned tolerance for a given control signal voltage. It is twice the tolerance because the output frequency depends on both the capacitor pair and the resistor set which can each vary a maximum of ±1.5%. Thus, the frequency of the output signal could vary between chips, at most ±30%, instead of the ±40% typical of prior art circuits.

While the invention has been described in detail by reference to the preferred embodiment described above, it is understood that variations and modifications thereof may be made without departing from the true spirit and scope of the invention.

Wherefore, what is claimed is:

1. An integrated voltage controlled oscillator circuit comprising:

(a) inputs for a clock signal and control signal, respectively;

(b) a control signal means connected to the clock signal and control signal inputs for outputting a signal having one of (i) a negative voltage, and (ii) a positive voltage;

(c) an integrator means connected to the output of the control signal means for one of (i) increasing, and (ii) decreasing a voltage of an output signal output from the integrator means, said increasing dependent on whether the voltage of the output of the control signal means is negative and said decreasing being dependent on whether the voltage of the output of the control signal means is positive; and, (d) a comparator unit means connected to the output of the integrator means for outputting a signal having a first voltage whenever the voltage of the signal output by the integrator means has increased to a first pre-determined level, and a second voltage whenever the voltage of the signal output by the integrator means has decreased to a second pre-determined level, said comparator unit means output signal being fed back to the control signal means and employed to cause the voltage of the signal output by the control signal means to be positive if the output of the comparator unit means is at the first voltage and to be negative if the output of the comparator unit means is at the second voltage; and wherein, e) the signal output by the integrator and comparator unit means is further dependent on the ratio of circuit components included within the integrated voltage controlled oscillator circuit.

2. A voltage controlled oscillator circuit in accordance with claim 1, wherein the control signal means comprises:
(a) first switching means for,
  (a1) switching a first side of a first capacitor between the control signal input and ground, said first switching means being switched by the clock signal such that the first side of the first capacitor is connected to the control signal input whenever the clock signal is high and to ground whenever the clock signal is low, and,
  (a2) switching a first side of a second capacitor having the same capacitance as the first capacitor between the control signal input and ground, said first switching means being switched by the clock signal such that the first side of the second capacitor is connected to ground whenever the clock signal is high and to the control signal input whenever the clock signal is low; and,
(b) second switching means for:
  (b1) switching a second side of the first capacitor between an output thereof corresponding to the output of the control signal means and ground, said second switching means being switched by a signal output by an exclusive-OR gate such that the second side of the first capacitor is connected to the second switching means output whenever the exclusive-OR gate signal is high and to ground whenever the exclusive-OR gate signal is low, and,
  (b2) switching a second side of the second capacitor between an output thereof corresponding to the output of the control signal means and ground, said second switching means being switched by a signal output by said exclusive-OR gate such that the second side of the second capacitor is connected to ground whenever the exclusive-OR gate signal is high and to the second switching means output whenever the exclusive-OR gate signal is low; and wherein,
(c) the exclusive-OR gate includes inputs thereto respectively connected to the clock signal input and the output of the comparator unit means such that the signal output by the exclusive-OR gate is inverted from the clock signal whenever the signal output by the comparator unit means is at the first voltage and is in phase with the clock signal whenever the signal output by the comparator unit means is at the second voltage.

3. A voltage controlled oscillator circuit in accordance with claim 1, wherein the integrator means comprises:
an operational amplifier with an inverting input connected to the output of the control signal means and a non-inverting input connected to ground, and having an output corresponding to the output of the integrator means fed back through a capacitor to the inverting input.

4. A voltage controlled oscillator in accordance with claim 1, wherein the comparator unit means comprises:
(a) a comparator with an inverting input connected to the output of the integrator means and an output corresponding to the output of the comparator unit means fed back through a voltage divider network to a non-inverting input; wherein,
(b) the voltage divider network comprises,
  (b1) a first resistor having a DC signal with pre-determined voltage fed into one side and a second side connected to a junction,
  (b2) a second resistor connected to ground on one side and to said junction on a second side, and,
  (b3) a third resistor having one side connected to the output of the comparator and a second side connected to said junction, and wherein,
  (b4) said junction is connected to the non-inverting input of the comparator.

5. A voltage controlled oscillator circuit comprising:
(a) inputs for a clock signal and control signal, respectively;
(b) a control signal means connected to the clock signal and control signal inputs for outputting a signal having one of (i) a negative voltage, and (ii) a positive voltage;
(c) an integrator means connected to the output of the control signal means for one of (i) increasing, and (ii) decreasing a voltage of an output signal output from the integrator means, said increasing dependent on whether the voltage of the output of the control signal means is negative and said decreasing being dependent on whether the voltage of the output of the control signal means is positive;
(d) a filter means having an input connected to the output of the integrator means and an output; and,
(e) a comparator unit means connected to the output of the filter means for outputting a signal having a first voltage whenever the voltage of the signal output by the integrator means has increased to a first pre-determined level, and a second voltage whenever the voltage of the signal output by the integrator means has decreased to a second pre-determined level, said comparator unit means output signal being fedback to the control signal means and employed to cause the voltage of the signal output by the control signal means to be positive if the output of the comparator unit means is at the first voltage and to be negative if the output of the comparator unit means is at the second voltage; and wherein, f) the signal output by the integrator and comparator unit means is further dependent on the ratio of circuit components included within the integrated voltage controlled oscillator circuit.

6. A voltage controlled oscillator circuit in accordance with claim 5, wherein the control signal means comprises:
(a) first switching means for, (a1) switching a first side of a first capacitor between the control signal input and ground, said first switching means being switched by the clock signal such that the first side of the first capacitor is connected to the control signal input whenever the clock signal is high and to ground whenever the clock signal is low, and, (a2) switching a first side of a second capacitor having the same capacitance as the first capacitor between the control signal input and ground, said first switching means being switched by the clock signal such that the first side of the second capacitor is connected to ground whenever the clock signal is high and to the control signal input whenever the clock signal is low; and, (b) second switching means for:

(b1) switching a second side of the first capacitor between an output thereof corresponding to the output of the control signal means and ground, said second switching means being switched by a signal output by an exclusive-OR gate such that the second side of the first capacitor is connected to the second switching means output whenever the exclusive-OR gate signal is high and to ground whenever the exclusive-OR gate signal is low, and, (b2) switching a second side of the second capacitor between an output thereof corresponding to the output of the control signal means and ground, said second switching means being switched by a signal output by said exclusive-OR gate such that the second side of the second capacitor is connected to ground whenever the exclusive-OR gate signal is high and to the second switching means output whenever the exclusive-OR gate signal is low; and wherein, (c) the exclusive-OR gate includes inputs thereto respectively connected to the clock signal input and the output of the comparator unit means such that the signal output by the exclusive-OR gate is inverted from the clock signal whenever the signal output by the comparator unit means is at the first voltage and is in phase with the clock signal whenever the signal output by the comparator unit means is at the second voltage.

7. A voltage controlled oscillator circuit in accordance with claim 6, wherein the integrator means comprises:

(a) an operational amplifier with an inverting input connected to the output of the control signal means and a non-inverting input connected to ground, and having an output corresponding to the output of the integrator means fed back through a third capacitor to the inverting input; and, (b) the increasing and decreasing of the voltage of the output signal output from the integrator means results from a voltage of a signal output from the operational amplifier one of (i) increasing, and (ii) decreasing in steps proportional to the ratio of the capacitance of the first or second capacitor, and the third capacitor.

8. A voltage controlled oscillator circuit in accordance with claim 7, wherein the filter comprises:

(a) a first resistor having one side connected to the output of the integrator means and a second side connected to the input of the comparator unit means; and, (b) a fourth capacitor connected on one side to the second side of the first resistor and on a second side to ground.

9. A voltage controlled oscillator circuit in accordance with claim 8, wherein the comparator unit means comprises:

(a) a comparator with an inverting input connected to the output of the integrator means and an output corresponding to the output of the comparator unit means fed back through a voltage divider network to a non-inverting input; wherein, (b) the voltage divider network comprises, (b1) a first resistor having a DC signal with predetermined voltage fed into one side and a second side connected to a junction, (b2) a second resistor connected to ground on one side and to said junction on a second side, and, (b3) a third resistor having one side connected to the output of the comparator and a second side connected to said junction, and wherein, (b4) said junction is connected to the non-inverting input of the comparator.

* * * * *